(12) United States Patent
Tanino

(10) Patent No.: US 6,268,061 B1
(45) Date of Patent: Jul. 31, 2001

(54) OBJECTS CONSTRUCTED OF SILICON CARBIDE

(75) Inventor: Kichiya Tanino, Hyogo-ken (JP)

(73) Assignee: Nippon Pillar Packaging Co., Ltd., Osaka (JP)

( * ) Notice: Subject to any disclaimer, the term of this patent is extended or adjusted under 35 U.S.C. 154(b) by 0 days.

(21) Appl. No.: 09/249,806

(22) Filed: Feb. 16, 1999

(30) Foreign Application Priority Data

Feb. 17, 1998 (JP) .................................................. 10-034406

(51) Int. Cl.[7] .............................. B32B 18/00; B32B 7/04; C23C 16/00
(52) U.S. Cl. ........................ 428/446; 428/220; 428/448; 428/698; 428/34.4; 427/589
(58) Field of Search .................................... 428/220, 332, 428/446, 448, 688, 689, 698, 34.4, 34.5, 34.6, 408; 148/DIG. 148; 264/682; 427/589; 501/88; 117/87

(56) References Cited

U.S. PATENT DOCUMENTS

| | | | |
|---|---|---|---|
| 4,921,554 | * 5/1990 | Bates et al. | 156/89 |
| 4,925,608 | * 5/1990 | Rossi et al. | 264/60 |
| 4,961,529 | * 10/1990 | Gottselig et al. | 228/124 |
| 5,037,502 | * 8/1991 | Suzuki et al. | 156/610 |
| 5,093,576 | * 3/1992 | Edmond et al. | 250/370.01 |
| 5,683,028 | * 11/1997 | Goela et al. | 228/121 |
| 5,882,807 | * 3/1999 | Funato et al. | 428/698 |
| 5,910,221 | * 6/1999 | Wu | 118/723 R |

* cited by examiner

Primary Examiner—Deborah Jones
Assistant Examiner—Michael LaVilla
(74) Attorney, Agent, or Firm—Griffin & Szipl, P.C.

(57) ABSTRACT

An object constructed of silicon carbide is made up of a plurality of sintered silicon carbide component parts in simple solid forms. This approach allows the production of objects having configurations that are obtainable only with difficulty or not at all by prior art approaches. The component parts are inseparably connected together by means of a silicon carbide film integrally formed on said component parts by chemical vapor deposition. In order to provide substantially improved joint strength and overall structural strength, the silicon carbide film preferably has a crystal structure in which the X-ray diffraction intensity ratio of each crystal face to the (111) face is 0.1 to 10 and/or in which the aspect ratio of crystal grains is 1 to 30.

11 Claims, 2 Drawing Sheets

(A)

(B)

(C)

OBJECTS CONSTRUCTED OF SILICON CARBIDE

BACKGROUND OF THE INVENTION

1. Field of the Invention

The present invention relates to objects constructed of silicon carbide such as a spin-coater used in semiconductor manufacturing equipment and optical elements such as soft X-ray reflectors (reflecting mirrors).

2. Description of the Prior Art

Objects constructed of silicon carbide, which are formed of sintered silicon carbide alone or formed as composite body of sintered silicon carbide coated with silicon carbide film, are finding use widely in equipment and component parts in various industrial and technical fields because of the outstanding features of silicon carbon, including a high degree of corrosion resistance, thermal conductivity, and wear resistance. Among the fields of use are semiconductor manufacturing equipment such as spin-coater, optical elements such as soft X-ray reflectors, and equipment and component parts in many different applications.

Silicon carbide film is especially excellent in physical and optical properties. It is used as an essential component part of objects constructed of silicon carbide in areas where the sintered silicon carbide alone cannot attain performances required of the silicon carbide object. It is also used where it is desired to further improve the performances exhibited by sintered silicon carbide. Silicon carbide film is formed on, for example: the wafer supporting surface of a spin-coater to be used for spin-coating of wafers where sticking of impurities has to be prevented at any cost (where the wafer must be protected from contamination); the reflective surface of soft X-ray reflector where a high degree of smoothness is required; and the area where a required high sealing air-tightness cannot be attained by porous sintered silicon carbide material.

The form of an object of constructed of silicon carbide (referred to as "the form of the constructed object" hereinafter) is mainly determined by the form of sintered silicon carbide, not only in the case where the object constructed of silicon carbide is made up of sintered silicon carbide alone but also in the case where it is a composite body with the surface of sintered silicon carbide coated with silicon carbide film. Hence, it is necessary to shape sintered silicon carbide in accordance with the form of the constructed object (that is, in a form identical or roughly identical with the form of the constructed object).

There is, however, a certain limit to the form of sintered silicon carbide that is obtained by forming and burning silicon carbide sintering material (silicon carbide powder or silicon carbide powder with a suitable binder mixed therewith). Sintered silicon carbide beyond that limit can not be obtained by sintering, that is, forming and heating alone. Thus, while sintered silicon carbide components in simple forms such as plate, bar, and cylinder can be produced by forming and heating alone, complicated forms such as those having portions of substantially differing thicknesses cannot be formed by forming and heating alone. In sum, a complicated form of the constructed object, which is determined by the form of sintered silicon carbide, has presented the following problems with manufacturing costs and application.

In the case where the form of the constructed object has both thick and thin portions, for example, sintered silicon carbide with a form corresponding to the form of the constructed object cannot be obtained by forming and heating alone but also additionally requires cutting and grinding. Thus, silicon carbide is first sintered to meet a desired size of the thick portion. The silicon carbide thus sintered is then cut and ground to a desired shape. This method naturally, therefore, presents some problems such as low production efficiency and increased manufacturing processes. Manufacturing economies deteriorate as the size differential between the thick portion and the thin portion (thickness difference) is increased or the relative amount of the thin portion is increased.

Another problem is that portions of sintered silicon carbide with silicon carbide film coated on the surface could deform or warp when the silicon carbide film is formed on the surface of the sintered silicon carbide. This is especially the case with thin portions; thick portions generally present no such problem. Thus, there is concern that the coated thin portion will warp when subjected to a high temperatures in application, because of the difference in coefficient of thermal expansion between the coated thin portion and the silicon carbide coat.

A further problem is that an object constructed of silicon carbide cannot be employed for uses in which, although application of an object constructed of silicon carbide would be desirable, the form of the object to be constructed is one which cannot be shaped by forming and heating silicon carbide sintering material nor by cutting (for instance, a hollow box shape). That is to say, use of silicon carbide is greatly limited by the required form of the constructed object.

SUMMARY OF THE INVENTION

It is an object of the present invention to provide various kinds of objects constructed of silicon carbide in various fields by solving the problems of manufacturing economies and application and use restriction, problems attributable to the form of constructed objects.

It is another object of the present invention to provide objects constructed of silicon carbide which, even if complicated in form and shape, do not present such problems of manufacturing economies and application as are encountered with prior art objects made of sintered silicon carbide, with or without a silicon carbide coat.

It is still another object of the present invention to provide objects constructed of silicon carbide which are formed in such shapes (hollow box and the like) which have been virtually impossible to obtain by prior art methods, and thus to provide a substantially increased scope of usage for silicon carbide.

It is a further object of the present invention to provide objects constructed of silicon carbide which are substantially improved in joint strength and overall structural strength by effectively avoiding film rupture due to concentration of stress. This is accomplished by allowing the silicon carbide film to have first and second crystal structures such that utility of the objects constructed of silicon carbide is not restricted on account of poor strength.

The present invention is based on a recognition that however complicated the required shape of an object constructed of silicon carbide is, it can be divided into simple solid or three-dimensional forms such as plate, cube, bar, cylinder, etc. and is an aggregation of such simple forms. Thus, to achieve the objects of the present invention, the object constructed of silicon carbide is allowed to be made up of a plurality of component parts (with simple forms) to be integrally combined.

That is, the object constructed of silicon carbide is made up of a plurality of sintered silicon carbide component parts formed in specific shapes which are inseparably joined to each other by silicon carbide film. The silicon carbide film is formed by chemical vapor deposition. The film extends over at least two sintered silicon carbide component parts and adheres to the surfaces of the same such that those component parts are inseparably coupled.

It is understood that sintered silicon carbide component parts formed in specific shapes are sintered silicon carbide in simple three-dimensional shapes obtained by forming and heating silicon carbide sintering material (silicon carbide powder with or without a suitable binder). The silicon carbide component parts include those obtained by forming and heating alone and also those processed (as by grinding to adjust the dimension and surface condition) to the extent that the original shape is not changed greatly, but exclude those subjected to cutting and grinding that greatly changes the original shape of the sintered silicon carbide obtained by forming and heating.

It is also understood that the positional relation between the sintered silicon carbide component parts connected by silicon carbide film is set so that the three-dimensional shape formed from the sintered silicon carbide component parts and silicon carbide film conforms to the required form of the objects to be constructed.

It is further noted that all the sintered silicon carbide component parts are coupled by the silicon carbide film formed by chemical vapor deposition, with the silicon carbide film extending over and adhering to the surfaces of at least two component parts. However, the preferred form of silicon carbide film is different depending on the properties required of the object constructed of silicon carbide, application conditions, the form of the constructed object, and other considerations. Thus, consideration of the form of the silicon carbide film may be divided into the case where a single silicon carbide film connects all the sintered carbide component parts and the case where multiple silicon carbide films connect the component parts.

In the former case, all of the sintered silicon carbide component parts are inseparably linked together by a single film of silicon carbide covering all the component parts. In other words, one silicon carbide film extends over all the component parts without interruption. In the latter case, the object constructed of silicon carbide may for instance made up of three component parts and two silicon carbon films. These three component parts may be inseparably bonded together by two silicon carbide films in this manner: a first film extends over and adheres to the surfaces of a first component part and a second component part for connecting the same; meanwhile, a second silicon carbide film extends over and adheres to the surfaces of the first component part and a third component part for connecting the same.

In the case of an object constructed of silicon carbide which has both thick portions and thin portions, both thick and thin portions are formed of sintered silicon carbide component parts, with or without a silicon carbide film formed on the surfaces by chemical vapor deposition. In addition, the thin portion may be formed of a silicon carbide film alone. That is, for instance, two sintered silicon carbide component parts which are positioned apart from each other may be inseparably connected by a silicon carbide film. This film, one part thereof attached to a surface of one component part and another part to a surface of the other component part, constitutes the intermediate thin portion spanning the two parts. Forming a thin portion of silicon carbide film alone in this manner makes it easy to build an object constructed of silicon carbide with a thin portion which is too thin to form by sintering silicon carbide because of difficulties encountered with forming and heating silicon carbide sintering material and the strength requirement. Further, in the case where a sintered object constructed of silicon carbide has a thin portion which is thick enough to be formed of sintered silicon carbide, if it is necessary to form the silicon carbide film on the surfaces of sintered silicon carbide, the thin portion could undergo deformation (warping) in high temperature applications because of the difference in coefficient of thermal expansion. No such problem would be encountered with the thin portion formed of silicon carbide film alone.

In those cases where it is not necessary to link two sintered silicon carbide component parts by a thin portion formed of silicon carbide film placed therebetween, if connecting the two silicon carbide component parts simply placed adjacent to each other does not provide sufficient joint strength, it is desirable to inseparably connect the two parts together in a protrusion-recess type engagement with silicon carbide film placed over the joint surfaces.

As mentioned earlier, the silicon carbide film is used to secure or improve the performance of the object constructed of silicon carbide and is also usable merely as a coupling means to connect sintered silicon carbide component parts. When it is not necessary to coat the object constructed of silicon carbide or part thereof (that is, a sintered silicon carbide component part) with the silicon carbide film, the sintered silicon carbide component parts may be fastened together with an adhesive or a joint (a bolt, for example). But an adhesive or a joint made of a material other than silicon carbide could lower the thermal resistance and strength at the connected portions or could result in contamination. Such problems can be avoided if the connecting means (adhesive or joint) is silicon carbide film which is the same substance with the sintered silicon carbide component parts.

It is also desirable that the silicon carbide has the following specific crystal structures (to avoid and disperse the concentration of stress due to tiny scratches or flaws on the surface) for improving the film strength. First, the silicon carbide film preferably has a crystal structure (referred to as a "first crystal structure" hereinafter) in which the X-ray diffraction intensity ratio of each crystal face to the (111) face specified by Miller's indices is 0.1 to 10. It is to be understood that the X-ray diffraction intensity ratio of each crystal plane to the (111) plane is a value obtained by dividing the peak intensity of each crystal face except for the (111) face, for instance, the (220) plane, by the peak intensity of the (111) face. The peak intensity is measured by the X-ray diffractometer (corrected by the powder X-ray diffraction value based on the ASTM standard). If, for example, the X-ray diffraction intensity ratio of the (220) face to the (111) face is 10, it means that the peak intensity of the (220) face is ten times as high as that of the (111) face. If the X-ray diffraction intensity ratio is 0.1, then the peak intensity of the (220) face is 1/10 that of the (111) face. That is, the peak intensity of the (111) face is 10 times as high as that of the (220) face. Therefore, an X- ray diffraction intensity ratio of each crystal face to the (111) face being 0.1 to 10 means that the peak intensity of any crystal face other than the (111) face does not exceed the level equal to 10 times as high as the peak intensity of the (111) face and the peak intensity of the (111) face does not exceed the level equal to 10 times that of any face other than the (111) face, either. In this regard, the (111) face is the highest in the orientation of the crystal face in the chemically vapor-deposited silicon carbide film, followed by the (220) face. In practice, therefore, it may safely be said that if the X-ray diffraction intensity ratio of the (220) face to the (110) face is 0.1 to 10, all the crystal faces meet the aforementioned requirement.

When the silicon carbide film is strongly oriented to a certain face (referred to as "specific face" hereinafter), then this film is an aggregation of columnar crystal grains and has crystals oriented in one direction. Stress could concentrate at a minute scratch on the film surface and lead to rupture of the film. If, on the other hand, the crystal structure of the silicon carbide film is such that the crystal structure of the film is not oriented to a specific crystal face, namely, the crystal grains are arranged randomly, then the concentration of stress at a minute scratch on the film surface would not cause film rupture starting with the film surface, because the stress would be dispersed in many directions, thereby making the level of stress working in each particular direction small. Experiments by the inventors have shown that if the peak intensity of a specific crystal face is more than 10 times as high as that of any other face, stress is liable to concentrate, resulting in film rupture. If, on the other hand, the peak intensity is not higher than 10 times, then the stress will be dispersed and film rupture will be unlikely. If, therefore, the silicon carbide film has the aforesaid first crystal structure, that is, a non-oriented crystal structure wherein the film is not oriented to any specific crystal face or a weakly oriented crystal structure wherein the orientation is very weak even if the film is oriented to a specific face, then the film strength is improved. That would raise the strength of a joint by the film between sintered silicon carbide component parts, that is, the strength of an object constructed of silicon carbide. It is noted that the peak intensity of the (111) face serves as a basis for specifying the X-ray diffraction intensity ratio of each crystal face because the orientation to the (111) face is the highest, as mentioned above.

As is known, the crystal structure of silicon carbide film obtained by chemical vapor deposition can be controlled freely to some extent by selecting film-forming conditions including vapor deposit rate, temperature, and others. Therefore, a silicon carbide having the first crystal structure can be obtained by chemical vapor deposition without difficulty if the film-forming conditions are set properly. It is also pointed out that even if a strong orientation to a specific crystal face, except for the (111) face, is observed in the film-forming stage, the first crystal structure can be brought about by subjecting the silicon carbide film bonded to the sintered silicon carbide component parts to a long heat treatment—for example, for 15 to 24 hours at 1800 to 2000° C.—after the film-forming step. Such heat treatment can reorient a silicon carbide film having a crystal structure with a strong orientation to, for instance, the (220) face which has a second highest orientation next to the (111) face—that is a crystal structure where the peak intensity of the (220) is more than 10 times as high as that of the (111) face (and those of the other crystal faces)—to a crystal form where Si and C atoms forming SiC are most stabilized. In that treatment, crystal grains in stable crystal form serve to promote reorientation of atoms forming other neighboring crystal grains such that the crystal grain boundary will disappear, starting crystal growth. As a result, orientation in the most stable direction of the (111) face will increase, while orientation to the (220) face will decrease, until the silicon carbide film is eventually shifted to the first crystal structure. That way, a silicon carbide with the first crystal structure can be obtained without difficulty by optimizing the film-forming conditions or by carrying out the heat treatment (which is conducted when necessary) under proper conditions after the film-forming step.

Secondly, it is desired that a silicon carbide has a crystal structure with a crystal grain aspect ratio of 1 to 30, preferably 1 to 20. For the purpose of simplicity, this crystal structure shall be hereinafter called the "second crystal structure." It is understood that the crystal grain aspect ratio is a value obtained by dividing the long diameter by the short diameter of the crystal grain and is a measure of the size of crystal grain.

When the silicon carbide film is formed of not perfect columnar crystal grains but of small crystal grains, that is, of an aggregation of small crystal grains, even if a concentrated stress occurs, the concentrated stress will be dispersed, thereby preventing film rupture due to the concentrated stress, just as with the first crystal structure. Experiment confirms that having crystal grains forming the silicon carbide film small-sized is effective for preventing the concentration of stress. An experiment showed that if the ratio of the short diameter to the long diameter of crystal grain—that is, the aspect ratio is not higher than 30—prevention of stress concentration is exhibited. Where the ratio was not higher than 20, especially good results were produced. It follows from this that film rupture by concentrated stress can be most effectively avoided if the silicon carbide film is both of the first crystal structure and of the second crystal structure.

DETAILED DESCRIPTION OF THE PREFERRED EMBODIMENTS

Now, the embodiments of the present invention will be described with reference to FIGS. 1 to 5. It should be understood that the terms "upper" and "lower," "above" and "under", and "vertical and horizontal" are applicable on the respective drawings only.

EXAMPLE 1

Figure 1:
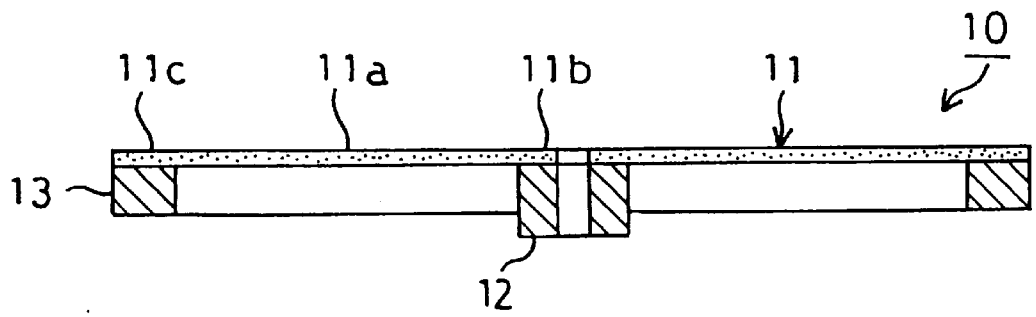
FIG. 1 is a vertical, sectional view of a spin-coater as first example of an object constructed of silicon carbide embodying the present invention.
Figure 2:
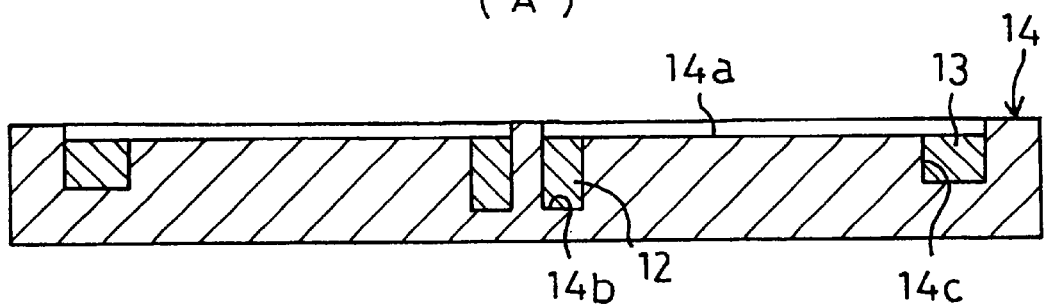
FIG. 2 provides vertical, sectional views corresponding to FIG. 1 of the spin-coater, showing manufacturing steps.
Figure 2:
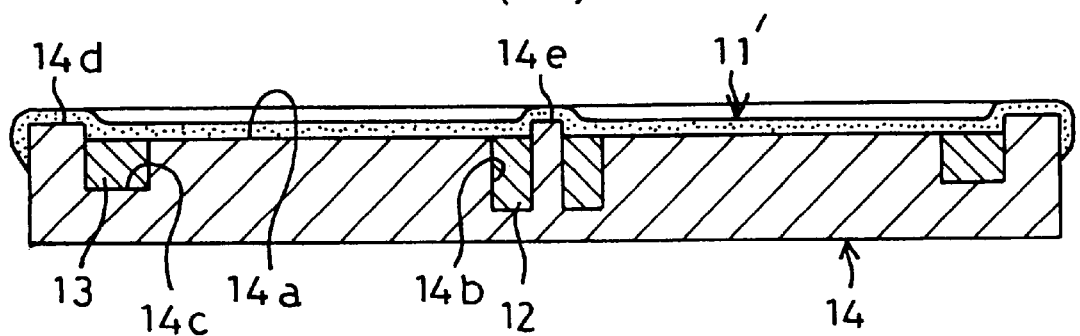
Figure 2:
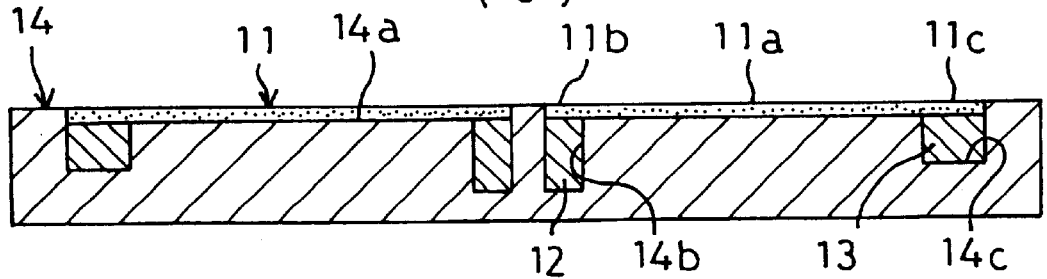

FIG. 1 and FIG. 2 are an example of the first embodiment of the present invention. This first embodiment relates to an application of the invention to a spin-coater for use in spin-coating of silicon wafer in the semiconductor manufacturing process. The spin-coater 10 is an object constructed of silicon carbide made up of a disk-shaped wafer support 11 to support the silicon wafer, a cylindrical hub 12 provided in the center of the wafer support 11 and an annular reinforcement 13 with a rectangular section provided around the periphery of the wafer support 11 as shown in FIG. 1.

The hub 12 and reinforcement 13 are both sintered silicon carbide component parts which are sintered silicon carbide obtained by forming and heating silicon carbide sintering material. Wafer support 11 is a silicon carbide film formed by chemical vapor deposition and stretching over and adhering to the upper surfaces of both the hub 12 and the reinforcement 13 as will be described later. This silicon carbide film has the first and second crystal structures to avoid concentration of stress for increasing the film strength as mentioned above. That is, the X-ray diffraction intensity ratio of each crystal face to the (111) face is 0.1 to 10 (first crystal structure) and the crystal grain aspect ratio is 1 to 30, preferably 1 to 20 (second crystal structure) in the crystal structure of the silicon carbide film 11.

Thus, the spin-coater 10 is an object constructed of silicon carbide which is made up of two sintered silicon carbide component parts 12, 13 in simple solid shapes (cylindrical or annular) which are placed apart and inseparably connected with each other by a chemically vapor deposited integral silicon carbide film 11 as shown in FIG. 1. That produces the following results.

The spin-coater 10 thus constituted satisfies the following requirements, that is, reducing weight of the spin-coater to speed up spin coating and forming the wafer support surface of a chemically vapor deposited silicon carbide film which is not contaminated by deposit of impurities. That is, this spin-coater 10 is formed only of silicon carbide film 11 except for only the minimum portions which cannot be made thin (small in thickness in the vertical direction) in consideration of the required performance and strength. Such minimum portions are the hub 12 which cannot be made thin because the spin-coater 10 is to be mounted on the rotary shaft with it and the reinforcement 13 to secure the required strength of the rotating spin-coater 10. Thus, since the spin-coater 10 is formed of only the silicon carbide film 11 except for those minimum portions, the overall weight of the spin-coater is very light. In addition, since the wafer support 11 is formed of chemically vapor deposited silicon film, the supported silicon wafer will not be contaminated.

It is also noted that though the wafer support 11, which is a major portion of this spin-coater 10, is a thin portion made of thin silicon carbide film alone, a sufficient overall strength is secured, because the chemically vapor deposited silicon carbide film itself is a fine grain, strong film and also because the wafer support 11 is fastened to the thick (in the vertical direction) portions of the hub 12 in the center and reinforcement 13 around the periphery. Furthermore, since the silicon carbide film 11 is improved in strength to the maximum extent by employing the first and second crystal structures as mentioned above, the spin-coater 10 is equal to or superior in mechanical strength to a prior art object constructed of silicon carbide, which prior art object is formed of sintered silicon carbide alone or is a composite body of sintered silicon carbide with the surface coated with silicon carbide film adhering thereto. This is true even though the spin-coater 10 is an aggregation of a plurality of sinter silicon carbide component parts integrally united to each other by means of silicon carbide film.

If the thin portion of the object constructed of silicon carbide is a composite body of sintered silicon carbide coated with silicon carbide film, the thin portion could deform (warp) because of the difference in coefficient of thermal expansion when subjected to a high temperature as mentioned earlier. But the spin-coater 10 built according to the present invention has the thin portion, i.e. an intermediate portion 11a between the hub 12 and the reinforcement 13, which is made of silicon carbide film only and can be used satisfactorily at a high temperature with no concern of the thin portion deforming or warping due to the difference in the coefficient of thermal expansion, unlike the aforesaid prior art composite body.

It is also pointed out that although the spin-coater 10 is complicated in structure wherein its two-thick portions of different thicknesses (i.e. a cylindrical thick portion comprising the hub 12 and a silicon carbide film portion 11b placed thereon and a annular thick portion comprising the reinforcement 13 and a silicon carbide film portion 11c placed thereon) are connected with each other by means of a doughnut-shaped thin portion, that is, a silicon carbon film portion 11a between the hub 12 and the reinforcement 13, there will not arise manufacturing economy problems such as those mentioned earlier, that is, low yields due to the need for cutting and grinding sintered silicon carbon. This is because the spin-coater is made by integrally combining sintered silicon carbide component parts 12, 13 in simple solid shapes obtained by forming and firing silicon carbide sintering material by means of a chemically vapor deposited silicon carbide film 11.

The spin-coater 10, an object constructed of silicon carbide of such configuration, can be made in the following manner.

First, the hub 12 and the reinforcement 13 are separately made by forming silicon carbide sintering material in the respective shapes, followed by heating. The sintered silicon carbide component parts—the hub 12 and the reinforcement 13—are both in simple solid shape (cylindrical and annular) and can be obtained by only forming and heating.

The hub 12 and the reinforcement 13 are placed in a vapor deposition mold 14 made of carbon as shown in FIG. 2(A). This vapor deposition mold 14 is so made to have depressions 14a, 14b, and 14c which roughly correspond to the overall shape of the spin-coater 10. In this regard, the vapor deposition mold 14 has in its upper surface portion a disk-like depression 14a which is identical with the wafer support 12 in diameter and whose depth is slightly greater than the thickness of the wafer support 12. In the center of the bottom of the disk-like depression 14a is formed a cylindrical depression 14b which corresponds to the shape of the hub 12. At the periphery of the bottom of the disk-like depression 14a is provided an annular depression 14c which corresponds to the shape of the reinforcement 13. The hub 12 and the reinforcement 13 are placed in the vapor deposition mold 14 wherein the hub 12 and the reinforcement 13 are disposed in the cylindrical depression 14b and the annular depression 14c, respectively.

Then, silicon carbide film 11' is formed by chemical vapor deposition on the entire surface of the vapor deposition mold 14 with the hub 12 and the reinforcement 13 set therein as shown in FIG. 2(B). Care is taken so that the thickness of silicon carbide film 11' is slightly larger than the size of the depth of the disk-like depression 14a. The chemical vapor deposition is carried out by a known technique, such as a normal pressure chemical vapor deposition (CVD) method, a vacuum CVD method, or an intermittent CVD. The film-forming conditions such as the temperature and rate of vapor deposition are set so that the silicon carbide film 11' will have both the first crystal structure and the second crystal structure. In case the film-forming conditions are such that the first crystal structure cannot be obtained—that is, the orientation to a specific crystal face, for instance, the (220) face, other than the (111) face is so strong that, for instance, the peak intensity of the (220) face is more than 10 times as high as that of the (111) face and any other crystal face—it is possible to bring about the first crystal structure by heat treatment after the film-forming step as mentioned earlier, for instance, after the step of destroying by fire the vapor deposition mold which will be explained later. The heat treatment is conducted at, for example, 1800 to 2000° C. for 15 to 20 hours.

In the next step, the excess portion of the silicon carbide film 11' is ground and removed, as shown in FIG. 2(C). That is, the upper surfaces of the formed silicon carbide film 11' are ground so as to make the silicon carbide film 11' equal to wafer support 11 in thickness. In this operation, parts of the vapor deposition mold 14, too, are ground such that the upper surfaces of the peripheral edge 14 outside the disk-like depression 14a and the upper surfaces of the shaft hole-forming part 14e that extends upwards and penetrates the hub 12 are removed.

Finally, the carbon vapor deposition mold 14 is destroyed by fire at a high temperature in an oxygen environment to obtain a spin-coater 10. The spin-coater 10 constitutes an object constructed of silicon carbide in which the hub 12 and the reinforcement 13 of sintered silicon carbide component parts are inseparably connected by silicon carbon film 11 stretching over and spanning the two parts, as shown in FIG. 1.

EXAMPLE 2

Figure 3:
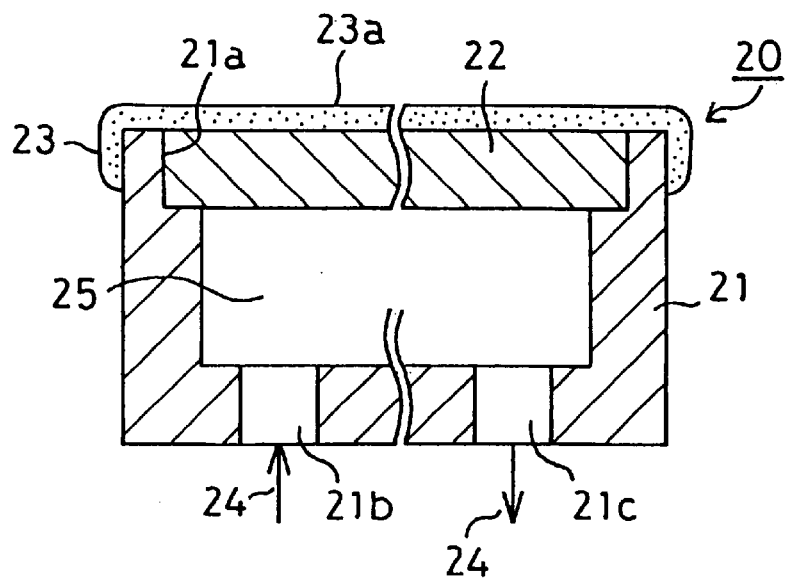
FIG. 3 is a vertical, sectional view of a soft X-ray reflector as second example of an object constructed of silicon carbide embodying the present invention.

FIG. 3 shows a second example of the present invention. In this example, the present invention is applied to a soft X-ray reflector or a reflecting mirror equipped with a cooling jacket. The soft X-ray reflector 20 is an object constructed of silicon carbide in the shape of a hollow box. It comprises a bottomed cylindrical jacket body 21, a plate-like reflector body 22 closing the top of the jacket body 21, and a silicon carbide film 23 including a reflective surface 23a formed on the reflector body 22, as shown in FIG. 3.

In this regard, the jacket body 21 is an open-top cylindrical sintered silicon carbide component part having at the top inner periphery an annular step portion, with which the circumferential edge of the reflector body 22 is engaged, and circulation ports 21b, 21c for cooling water 24 at the bottom. The jacket body 21 is a sintered silicon carbide component part made by forming and heating silicon carbide sintering material. This kind of bottomed cylinder is in a simple solid shape and can be made simply by forming and heating. The step portion 21a or circulation ports 21b, 21c can be formed by cutting as necessary after the forming and heating steps. This cutting operation to make the step portion 21a or circulation ports 21b, 21c is to cut only small portions and hence would not lower the manufacturing economies e.g. with decreased yield as indicated earlier.

The reflector body 22 is a sintered silicon carbide component part in the shape of a simple solid plate which is a sintered silicon carbide obtained by forming and heating silicon carbide sintering material.

The jacket body 21 and the reflector body 22 are inseparably and integrally connected to each other, with the reflector 22 engaging with the step portion 21a of the jacket body 21, by forming an uninterrupted silicon carbide film 23 on the surfaces of the connected portions and the reflector body 22 by chemical vapor deposition and sticking the film 23 to the same. The silicon carbide film 23 is of the same crystal structure (first and second crystal structures) as the silicon carbide film constituting the wafer support 11 of the spin-coater. The first and second crystal structures are attained the same way as in the first example. The first crystal structure may be gained either in the film-forming stage or by heat treatment after that. Chemical vapor deposition is carried out with masking applied to the parts where formation of the silicon carbide 23 is not necessary (the surface of the jacket body 21 except for the top).

The silicon carbide film 23 thus formed is then polished on the part corresponding to the reflective surface 23a (that is, the film portion at the top of the reflector body 23) by a conventional method and is mirror-finished to form the reflective surface 23a.

In the soft X-ray reflector 20 configured in this way, the space defined between the two bodies 21, 22 can serve as cooling jacket 25 to cool the reflector body 22 and the reflective surface 23a, with cooling water circulated through the circulation ports 21b, 21c. Performance of the soft X-ray reflector 20 provided with such a cooling jacket 25 will not be disrupted by heat generated by soft X-ray irradiated on the reflective surface 23a, and so the function of the soft X-ray reflector can be maintained at a high level for a long time.

It is also pointed out that reflector body 22 engages with the step portion 21a of the jacket body 21, with the two bodies 21, 22 connected by silicon carbide film 23 formed on and adhering to the surfaces of the bodies 21, 22, including the surfaces of the connected portions. Because of this and also because silicon carbide film 23 is of both the first and second crystal structures which are effective in preventing film rupture due to concentration of stress, the joint between the two bodies 21, 22 is very high in strength and air tightness.

As a result, a good cooling function can be maintained without the cooling water 24 supplied to the cooling jacket 25 leaking out through the joint area.

It is also noted that, since the reflector 20 is made up of a plurality of sintered silicon carbide component parts 21, 22 and the connecting means is the silicon carbide film 23 formed by chemical vapor deposition, no heat deformation will occur due to a difference in coefficient of thermal expansion, unlike the case where a bond or a connecting means of a material different from silicon carbide is used to lock the component parts together.

While the invention has been described with reference to preferred embodiment thereof, it is to be understood that the invention is not limited thereto and that modifications or variations may be made in the invention without departing from the spirit and scope thereof.

Figure 4:
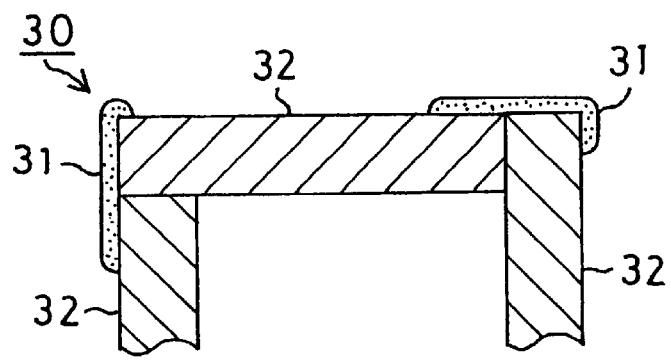
FIG. 4 is a vertical, sectional view showing the core part of a variation of an object constructed of silicon carbide embodying the present invention.
Figure 5:
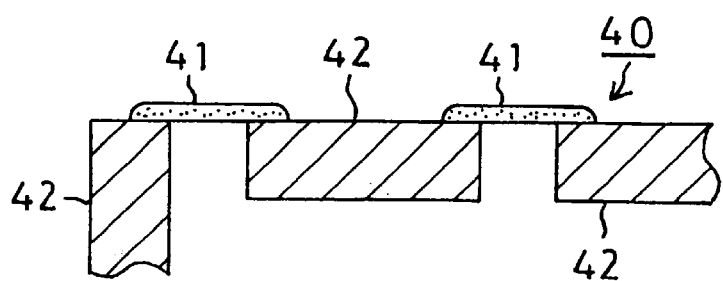
FIG. 5 is a vertical, sectional view showing the core part of another variation of an object constructed of silicon carbide embodying the present invention.

In the described spin-coater 10 or the soft X-ray reflector 20, for example, silicon carbide films 11, 23—which are necessary to secure and improve the performance thereof—are also used as means for connecting together silicon carbide component parts 12 and 13 or 21 and 22. The present invention can also be applied to the objects 30, 40 constructed of silicon carbide in which these silicon carbide films 31, 41 may be used merely as means for connecting the sintered silicon carbide component parts 32 . . . , 42 . . . in the present invention in such a way as shown in FIG. 4 and FIG. 5. In such cases, silicon carbide films 31, 41 may be formed on and stuck only to the areas where the films 31, 41 are required as connecting means, whether the component parts 32, 32 are placed in contact with each other (FIG. 4) or the component parts 42, 42 are placed apart from each other (FIG. 5). In case a high joint strength is required in connecting together sintered silicon carbide component parts 21, 22 in a contact state, the component parts should be connected in a recess-protrusion engagement, as shown in FIG. 3. It is desired that engaging parts should be shaped in those configurations which can be shaped by forming and heating silicon carbide sintering material. If no such high joint strength is needed, the component parts 32, 32 may be connected by the silicon carbide film 31 with the sintered silicon carbide component parts 32, 32 merely placed in contact with each other (FIG. 4).

The materials and shapes (for instance, film thicknesses) of sintered silicon carbide component parts and silicon carbide film may be properly selected or set according to such factors as form (form of the constructed object) and performance and application conditions required of the object constructed of silicon carbide. It is, of course, necessary to design the sintered silicon carbide component parts in simple solid forms that can be shaped by the forming and heating step. It is noted that minor working, such as by cutting and grinding to improve dimensional precision, may be sometimes additionally needed after the forming and heating step.

What is claimed is:

1. A composite object formed by a process comprising the steps of providing a plurality of sintered silicon carbide component parts and forming at least one component part consisting essentially of silicon carbide film by chemical vapor deposition integral with and connecting said sintered silicon carbide component parts;

wherein said silicon carbide film has a crystal structure in which the X-ray diffraction intensity ratio of any crystal face excluding the (111) face to the (111) face as indicated by Miller's indices is in the range 0.1 to 10.

2. The composite silicon carbide object of claim 1, wherein said silicon carbide film has a crystal structure in which the aspect ratio of crystal grains is in the range 1 to 30.

3. A composite object formed by a process comprising the steps of providing a plurality of sintered silicon carbide component parts and forming at least one component part consisting essentially of silicon carbide film by chemical vapor deposition integral with and connecting said sintered silicon carbide component parts;

wherein said silicon carbide film has a crystal structure in which the aspect ratio of crystal grains is in the range 1 to 30.

4. A composite object constructed of silicon carbide, wherein a plurality of sintered silicon carbide component parts formed in specific shapes are inseparably and integrally connected together by means of silicon carbide film, said film being formed by chemical vapor deposition on, stretching over the surfaces of, and adhering to at least two sintered silicon carbide component parts; and wherein said silicon carbide film has a crystal structure in which the X-ray diffraction intensity ratio of any crystal face excluding the (111) face to the (111) face as indicated by Miller's indices is in the range 0.1 to 10.

5. The composite silicon carbide object of claim 4, wherein said silicon carbide film has a crystal structure in which the aspect ratio of crystal grains is in the range 1 to 30.

6. The composite silicon carbide object of claim 4, wherein all of the sintered silicon carbide component parts are connected together by means of an integrally formed silicon carbide film.

7. The composite silicon carbide object of claim 4, wherein at least two sintered silicon carbide component parts are inseparably connected together in a recess-protrusion engagement by silicon carbide film bonded to the surfaces of the engaging portions.

8. A composite object constructed of silicon carbide, wherein a plurality of sintered silicon carbide component parts formed in specific shapes are inseparably and integrally connected together by means of silicon carbide film, said film being formed by chemical vapor deposition on, stretching over the surfaces of, and adhering to at least two sintered silicon carbide component parts; and wherein said silicon carbide film has a crystal structure in which the aspect ratio of crystal grains is in the range 1 to 30.

9. A composite object constructed of silicon carbide, wherein a plurality of sintered silicon carbide component parts formed in specific shapes are inseparably and integrally connected together by means of silicon carbide film, said film being formed by chemical vapor deposition on, stretching over the surfaces of, and adhering to at least two sintered silicon carbide component parts;

wherein a thin portion of said object constructed of silicon carbide is formed exclusively of an intermediate portion of said silicon carbide film located between said sintered silicon carbide component parts;

wherein said silicon carbide film has a crystal structure in which the X-ray diffraction intensity ratio of any crystal face excluding the (111) face to the (111) face as indicated by Miller's indices is in the range 0.1 to 10.

10. The composite silicon carbide object of claim 9, wherein said silicon carbide film has a crystal structure in which the aspect ratio of crystal grains is in the range 1 to 30.

11. A composite object constructed of silicon carbide, wherein a plurality of sintered silicon carbide component parts formed in specific shapes are inseparably and integrally connected together by means of silicon carbide film, said film being formed by chemical vapor deposition on, stretching over the surfaces of, and adhering to at least two sintered silicon carbide component parts;

wherein a thin portion of said object constructed of silicon carbide is formed exclusively of an intermediate portion of said silicon carbide film located between said sintered silicon carbide component parts;

wherein said silicon carbide film has a crystal structure in which the aspect ratio of crystal grains is in the range 1 to 30.

* * * * *